United States Patent [19]

Kasai et al.

[11] Patent Number: 4,579,022

[45] Date of Patent: Apr. 1, 1986

[54] MAKING PROCESS OF A DIE FOR STAMPING OUT PATTERNS

[75] Inventors: Yasuo Kasai; Koichi Yamada; Teruo Sakuma; Masahiro Koguchi, all of Tokyo, Japan

[73] Assignee: Fujikura Cable Works, Ltd., Japan

[21] Appl. No.: 539,799

[22] Filed: Oct. 7, 1983

Related U.S. Application Data

[63] Continuation of Ser. No. 219,223, Dec. 22, 1980, abandoned.

[30] Foreign Application Priority Data

Dec. 20, 1979 [JP] Japan ................. 54-166625
Feb. 21, 1980 [JP] Japan ................. 55-20752
Mar. 28, 1980 [JP] Japan ................. 55-39781
Apr. 18, 1980 [JP] Japan ................. 55-45950
Jul. 28, 1980 [JP] Japan ................. 55-103412

[51] Int. Cl.[4] .............................................. B21K 5/20
[52] U.S. Cl. ................... 76/107 R; 72/325; 156/659.1; 156/656; 156/645
[58] Field of Search ............... 29/846; 156/659.1, 656, 156/645, 650, 651, 251, 261, 654, 905; 76/101 R, 107 R, 101 SM, 104 R; 72/325, 326, 331

[56] References Cited

U.S. PATENT DOCUMENTS

| 1,709,327 | 4/1929 | Spalding et al. | 156/651 |
| 2,026,603 | 1/1936 | Zarse | 156/651 |
| 2,401,472 | 6/1946 | Franklin | 156/251 |
| 3,045,321 | 7/1962 | McDermott | 76/107 R |
| 3,513,052 | 5/1970 | Ariyasu et al. | 156/251 |
| 3,629,035 | 12/1971 | Kuroda | 156/251 |
| 3,741,764 | 6/1973 | Weglin | 430/432 |
| 3,756,888 | 9/1973 | Kuroda | 156/251 |
| 3,758,350 | 9/1973 | Weglin | 156/650 |
| 3,859,150 | 1/1975 | Van Amburg | 156/251 |
| 3,970,023 | 7/1976 | Herbst et al. | 72/325 |
| 4,053,348 | 10/1977 | Weglin | 156/659.1 |
| 4,135,964 | 1/1979 | Tanaka et al. | 156/661.1 |
| 4,247,350 | 1/1981 | McIntyre et al. | 156/251 |
| 4,294,649 | 10/1981 | Sarka | 156/659.1 |

FOREIGN PATENT DOCUMENTS 1393611 5/1975 United Kingdom ............. 76/104 R

Primary Examiner—Daniel C. Crane
Attorney, Agent, or Firm—Hill, Van Santen, Steadman & Simpson

[57] ABSTRACT

The invention provides a novel method for manufacturing a knife-edge die for stamping out a metal foil on an insulating base plate such as in the preparation of an electronic circuit board by a technique of photoetching. The method comprises a line pattern of a photoresist film on the die face corresponding to the contour of the desired pattern, subjecting the die face to a first etching to effect substantial side etching behind the photoresist film to leave an edge, removing the photoresist film and subjecting the die face to a second etching to sharpen the edge into a knife edge. The invention further proposes several improvements in the knife-edge die manufactured in the same principle of the method as above such as the adjustment of the depth of the inside recess surrounded by the knife edge with a filling material and knife-edge dies suitable for continuous stamping out provided with one or more of flat-headed presser dies for the preliminary bonding of the metal foil to the base plate prior to stamping out with the knife edge and one or more limiter dies provided on one or both sides of the knife edge in order to prevent unduly deep incision of the knife edge to the base plate.

1 Claim, 36 Drawing Figures

MAKING PROCESS OF A DIE FOR STAMPING OUT PATTERNS

This is a continuation of application Ser No. 219,223, filed Dec. 22, 1980, now abandoned.

BACKGROUND OF THE INVENTION

The present invention primarily relates to a method for making a so-called knife-edge die for stamping out a pattern such as in the preparation of an electronic circuit board having pattern-wise electroconductive circuits of a metal foil bonded on the surface of an insulating base board. Such circuit boards with patterned circuits are manufactured in various ways but it is one of efficient ways to stamp out the pattern on the base board with a knife-edge die.

The knife-edge die generally has a configuration that an upstanding knife edge is provided on a die block in a closed curve line making a die element corresponding to the contour line of each of the patterns to be stamped out. The inside area on the die face surrounded by the knife-edge line of the die element and the outside area surrounding the die element are both recessed relative to the sharpened knife edge, usually, in a depth of up to a few tenths of millimeter.

These knife-edge dies for stamping out are made usually by the techniques of etching using a photoresist film provided on a die block of low carbon steel or other suitable hard material in a form corresponding to the desired pattern. The making process of such a die is therefore very complicated with repetition of etching and a high degree of skillfulness is required for the workers so that unavoidable difficulties are encountered when a shorter time for making them and lower costs are desired.

Various attempts have been made for improving the die making process utilizing the techniques of etching but none of them are satisfactory in one or other aspects (see, for example, U.S. Pat. Nos. 3,741,764 and 3,758,350).

SUMMARY OF THE INVENTION

It is a primary object of the present invention, therefore, to provide a novel and improved method for making a knife-edge die for stamping out a pattern of a metal foil on a base plate such as in the preparation of a patterned electronic circuit board, by which any dies having complicated patterns can be made readily and efficiently even by an unskilled worker.

The method of the present invention, which is an etching method in principle, for making a knife-edge die for stamping out comprises the steps of (a) putting a transparency bearing a line pattern having a uniform line width, the center line of the said line pattern relative to the width thereof being along the contour line of the pattern desired to be stamped out, on the surface of a die block coated with a film of a photoresist material in an intimate contact, (b) irradiating the photoresist film with light through the transparency to have the photoresist material photocured under the line pattern on the transparency;

(c) developing the photoresist material to leave the photocured film pattern-wise corresponding to the line pattern on the transparency, (d) subjecting the die block to a first etching to such an extent that substantial side etching takes place behind the photoresist film but an edge is left along the center line of the line pattern, (e) removing the photoresist film from the die block so as to expose the edge bare, and (f) subjecting the thus exposed edge to a second etching to such an extent that a knife edge is formed.

Being freed from the problems in the prior art methods, the above described inventive method for die making is very advantageous since a very incisive knife-edge die with any complicated patterns can be made in a relatively simple process with no specific facilities or equipment.

Further, the inventors' investigations have been directed to some improvements in relation to the knife-edge dies for stamping out in several aspects in order to overcome various inconveniences and low efficiency in the prior art dies as described hereunder. The results of the further improvements are also included in this application.

DETAILED DESCRIPTION OF THE PREFERRED EMBODIMENTS

The inventive method for making a knife-edge die used for stamping out a pattern of a metal foil or the like is best illustrated with reference to the accompanying drawing.

Figure 1:
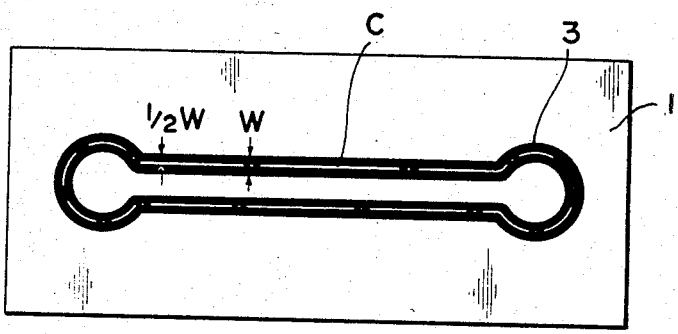
FIG. 1 is an illustration of a schematic example of the artwork figure drawn on a transparent sheet.

The first step of the method is the preparation of a negative transparency bearing the desired line pattern. The process of this step is rather conventional and carried out by drawing with an automatic NC (numerically controlled) drawing machine on a transparent film or paper. The thus drawn artwork FIG. 1 has a line pattern 3 with a uniform width W all over its length of the closed curve line as is shown in FIG. 1. The center line C of the line pattern 3 should be in conformity with the contour line of the desired pattern to be stamped out with the die. That is, the line pattern 3 is drawn with a width to extend on both sides of this center line C in a width of $\frac{1}{2}W$ on each side so that the line pattern itself has a uniform width W all over the length thereof. The width W of the line pattern is preferably in the range from 0.1 to 2.0 mm. It is an easy matter to prepare a negative transparency from this artwork figure by a photographic technique.

Figure 2:
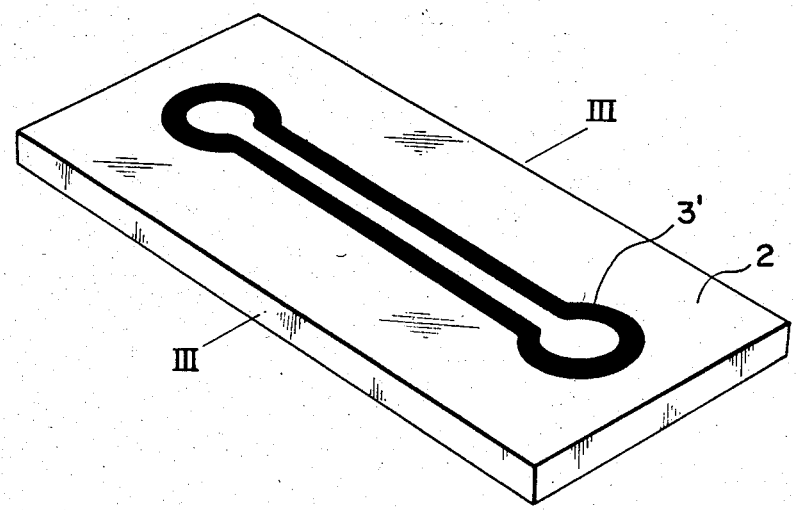
FIG. 2 is a perspective view of a die block provided with a photoresist film in a form of a line pattern.
Figure 3:
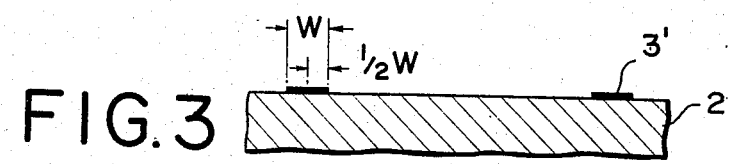
FIGS. 3 to 7 illustrate the die making process by the etching method.

The next step of the method is the formation of the pattern-wise photoresist film on the surface of a die block, which is usually a steel plate well tempered and polished at least on one surface in advance. The process of this photoetching is also conventional and need not be described in detail here. Thus, the above prepared negative transparency is placed in direct contact on the surface of the die block 2 coated with a film of a photoresist material and the photoresist film is irradiated with light from above through the negative transparency so as that the photoresist material on the areas not shielded by the negative transparency, i.e. the areas corresponding to the line drawing 3 on the artwork FIG. 1, is photocured. Subsequent development treatment of the photoresist material by dissolving away the uncured photoresist material leaves a pattern-wise photocured layer 3' of the photoresist material on the die block 2 corresponding to the line pattern 3 as is shown in FIG. 2 by a perspective view. FIG. 3 is a cross sectional view of the die block in FIG. 2 as cut and viewed along the line III—III in FIG. 2 showing the width W of the photoresist film 3' in the form of a reproduction of the line pattern 3.

Figure 4:
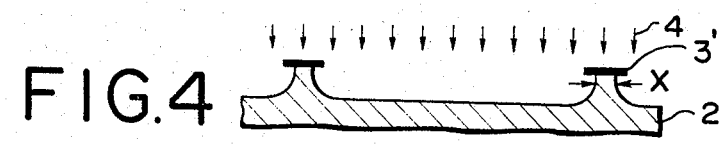
Figure 5:
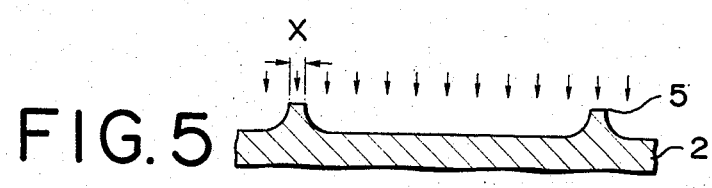

Next comes the step of the first etching of the die face thus provided with the pattern-wise photoresist film 3' with an etching solution. The etching proceeds in the direction perpendicular to the surface of the die face as is shown by the arrows 4 in FIG. 4 but, as the etching proceeds far and far, so-called side etching takes place behind the pattern-wise photoresist film 3'. This etching treatment is continued to such an extent that an edge is left as is shown in FIG. 4, of which the width x of the line-wise top flat is somewhat smaller than the width W of the pattern-wise photoresist film 3'. The width x should be determined with consideration of various parameters such as the material of the die block, strength of the etching solution and the like but it is preferably in the range from 0.05 to 0.4 mm. Thereafter, the pattern-wise photoresist film 3' left on the top flat of the thus formed edge 5 is removed mechanically or by dissolving away with a solvent so that the top flat of the edge 5 with the width x is exposed bare as is shown in FIG. 5. Provided that the etching has proceeded smoothly and evenly, the center line of the line-wise top flat of the thus formed edge 5 is also in conformity with the contour line of the desired pattern to be stamped out with the die, the top flat extending on both sides of the center line in a width of $\frac{1}{2}x$ on each side to form the width x jointly.

Figure 6:
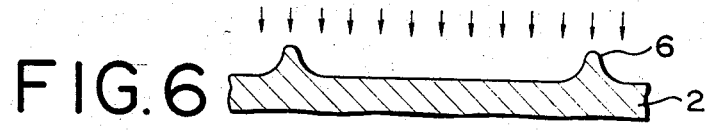
Figure 7:
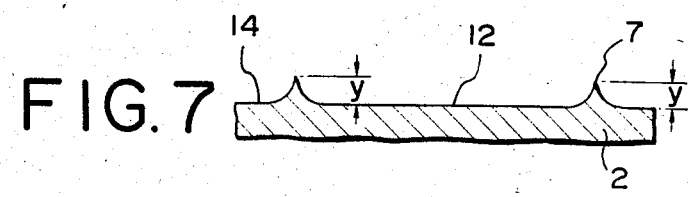

The die face provided with the thus formed edge 5 is then subjected to the second etching with an etching solution. The etching solution used in this second etching may be the same one as or different one from that used in the first etching according to need. The attack of the etching solution is mainly in the perpendicular direction to the die face as is shown by the arrows 4 in FIG. 5 but the surface of the exposed edge 5 is also subject to the attack of the etching solution so that the line edge 5 is first chamfered into a rounded edge 6 as is shown in FIG. 6 and, as the etching proceeds so far, a very sharp and incisive knife edge 7 is finished as shown in FIG. 7. In this finished state, the depth y of the inside recess 12 surrounded by the line-wise knife edge 7 or the height y of the knife edge 7 is equal to the depth of the outside areas 14 surrounding the knife edge 7.

As is understood from the above description, the inventive method is very advantageous in that a knife-edge die with any complicated pattern is readily made in a simple process with marked inexpensiveness, that the knife-edge die obtained by the method is very incisive and suitable for use in stamping out various materials including metal foils and plastic sheets, that the dimensional accuracy of the line-wise knife edge is very high giving high-accuracy stamped-out patterns and that a knife edge worn out by repeated use can be refinished to regain the incisiveness. These advantages are difficult to obtain in the prior art methods in which the sidewalls of the edge are finished one by one regardless of the principle of working which may be either machining or chemical etching.

In a prior art knife-edge die for stamping out, it is usual that the depth y' of the inside recess surrounded by the line-wise knife edge is smaller than the depth y of the outside recessed areas surrounding the pattern to be stamped out as encircled by the line-wise knife edge. Such a depth difference between the inside and outside recessed areas is significant when the knife-edge die is used for simultaneous stamping out and adhesive bonding of a metal foil on an insulating resin plate since the metal foil in the area inside the line-wise knife edge is pressed more strongly to the base plate by the inside recess with a smaller depth than in the outside areas of the pattern to be stamped out. A problem of such a die face is that the die is more expensive than an equal-depth die due to the complicated making process of the die.

The inventors have unexpectedly arrived at a discovery that the above mentioned problem of the expensiveness in the prior art dies can be overcome by use of the inventive knife-edge die, which in principle has an equal depth in the inside and outside recessed areas, by filling the inside recessed area with a suitable filling material so as that the effective depth y' in the inside recessed area surrounded by the knife edge is adjusted to be smaller than the depth y in the outside areas surrounding the pattern to be stamped out.

Figure 8:
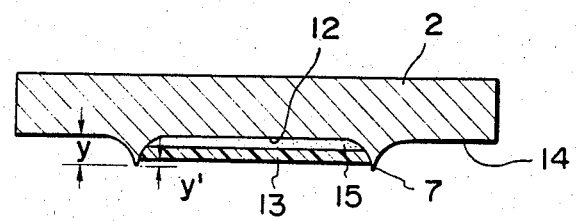
FIG. 8 is a cross sectional view of a knife-edge die having an effective depth of the inside recess reduced by filling with a filling material.

FIG. 8 is a schematic illustration of a cross section of such a knife-edge die 2 of which the depth of the inside recess is adjusted to y' by filling with a filling material 13. Suitable filling materials are exemplified by heat-resistant synthetic resins and rubbers such as polytetrafluoroethylene and silicone rubber having sufficient stability at 150° C. or higher temperatures or low-melting alloys and copper in the form of a sheet. These sheet materials 13 have desirably a smooth surface and bonded to the die face in the inside recessed area 12 by use of a suitable heat-resistant adhesive agent or sticking agent 15. The thickness of the filling sheet 13 is of course determined in consideration of the desired depth difference y—y' between the die face in the outside areas 14 and the outer surface of the filling material 13 bonded to the die face within the inside recess 12 of the die element.

Figure 9:
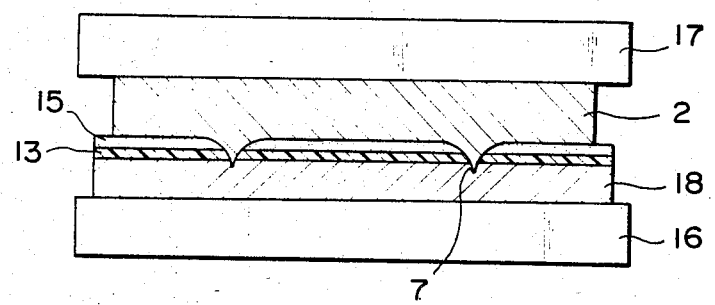
FIG. 9 illustrates the method for filling the inside recess with a filling material by use of a press.

Bonding of the filling material 13 to the die face in the inside recessed area 12 is readily carried out in a manner as follows. That is, the knife-edge die 2 is mounted to the upper die-set 17 of a press to have the knife edge 7 facing downwardly and the die-set 17 is lowered toward the filling sheet 13 coated with an adhesive agent 15 placed on the lower bed 16 of the press with a backing plate 18 therebetween. As the die-set 17 is lowered further, the filling sheet 13 is severed as cut by the knife edge 7 as is shown in FIG. 9 and bonded adhesively to the die face of the knife-edge die 2. After cooling, the filling sheet 13 bonded to the die face in the outside recess 14 is removed by peeling. It is advisable that the die face in the outside recess 14 is treated in advance with a releasing agent so as that removal of the extraneous portion of the filling sheet 13 is facilitated. If necessary, the above procedure is repeated as many times as desired so that the inside recess 12 is filled with a plural number of the filling sheets 13 in stratification until the depth of the inside recess y' reaches the desired level to have a most effective depth difference y—y' between the inside and outside recesses 12 and 14. In other words, the depth difference is adjustable with the number of the filling sheets 13.

Figure 10:
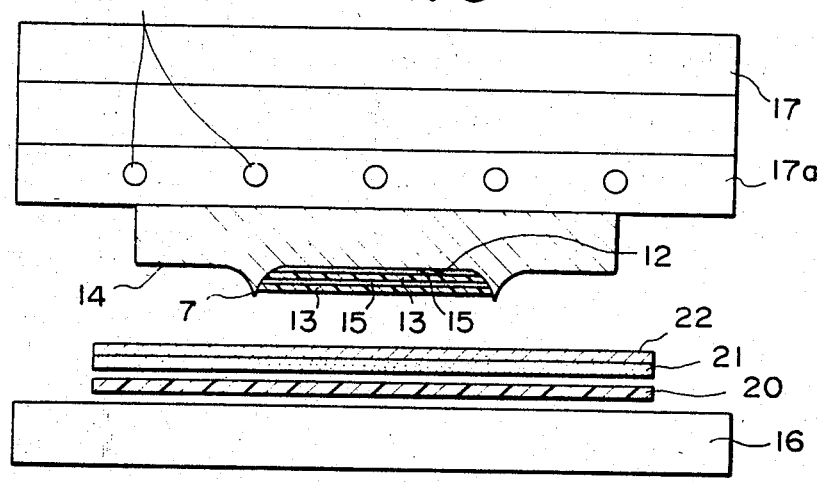
FIG. 10 illustrates the manner for stamping out a metal foil on a base plate with the knife-edge die having a reduced effective depth in the inside recess.
Figure 11:
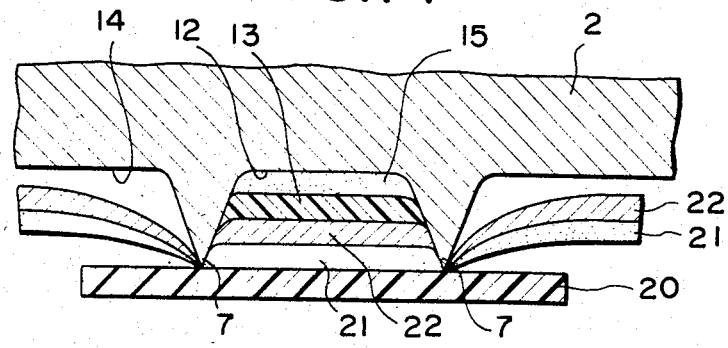
FIG. 11 is an illustration of the process of stamping out at the moment when the metal foil is just cut by the knife edge.
Figure 12:
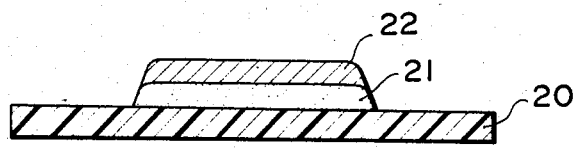
FIG. 12 is a schematic cross sectional view of a circuit board prepared by stamping out and FIG. 13 is a perspective view of the same.
Figure 13:
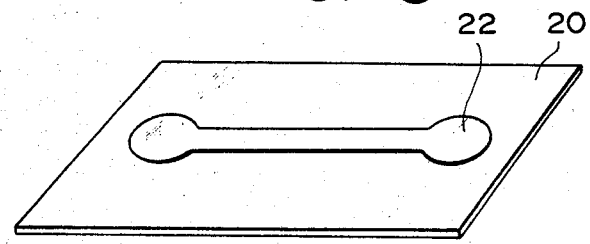

The manner in which the above prepared knife-edge die 2 is used is not particularly different from the manner for conventional dies. As is shown in FIG. 10, the die 2 is mounted on the upper die-set 17 with a hot-plate 17a heated by the tubular heaters 17b with the knife edge 7 facing downwardly. On the other hand, an insulating base plate 20 and a metal foil 22 coated with an adhesive agent 21 are placed on the lower bed 16 of the press with the latter on the former sandwiching the adhesive layer 21 therebetween. As the upper die-set 17 is lowered, the metal foil 21 is stamped to the surface of the base plate 20 and bonded thereto with the adhesive agent 21 as cut by the knife edge 7 and pressed by the surface of the filling material of the die face in the inside recessed area 12 surrounded by the knife edge 7 as is shown in FIG. 11 by an enlarged cross section. The metal foil 22 facing the outside recessed areas 14 surrounding the knife edge 7 is not bonded to the surface of the base plate 20 because the metal foil 22 in these areas is not under pressure with the die face 14 owing to the depth difference between the die faces in the inside and outside recessed areas 12 and 14. FIG. 12 and FIG. 13 are each a cross sectional view and a perspective view, respectively, of the thus obtained electronic circuit board having a pattern-wise metal foil 22 stamped out by the die and adhesively bonded to the surface of the insulating base plate 20 with the adhesive agent 21.

In addition to the above described method of stamp-bonding of a pattern-wise metal foil on to the surface of a base plate to form a circuit board or the like, the inventive knife-edge die is also suitable for use in punch-cutting of a single thin sheet-like material.

Generally, punch-cutting of a thin, sheet-like material is performed with a punching die. As the thickness of the sheet material to be punch-cut is decreased, the accuracy of clearance of the punching die must be higher so that very careful and elaborate techniques are required in making the punching die. Therefore, a punching die for punch-cutting of a complicated pattern is very expensive owing to a so lengthy time taken for die making. With an object to decrease the time for making a punching die with consequent cost decrease, a punching die having a simplified structure of the so-called Victoria type is proposed in addition to ordinary punching dies. The Victoria type punching die is, however, not suitable for punch-cutting of a complicated pattern since such a die is manufactured by implanting an edged band steel bent or curved by machining into a stand. No satisfactory dimensional accuracy of the punched pattern is obtained with such a simplified punching die and, in addition, the die is not free from the problem of the deformation of the knife edge causing dimensional inaccuracy during use.

On the other hand, remarkable effects are obtained when the knife-edge die of the present invention is used for punch-cutting of a thin, sheet-like material. That is, the time for the die making of the inventive die is rather shorter than the time for making an above mentioned punching die of the simplified structure. Further, no skillful techniques are required for obtaining a satisfactorily high accuracy of clearance such as in the die making of the punching dies. In addition, the time required for die making is almost independent on the degree of complication of the pattern to be punch-cut with the die since the edge pattern of the knife-edge die of any complication is obtained readily in accordance with the pattern drawn on the artwork figure.

In addition, the dimensional accuracy of the edge pattern is very high since the knife edge is formed directly on the die face by etching and the thus formed knife edge is not susceptible to deformation during use. Owing to the absence of the step of machine working, the steel material of the die block can be in advance heat-treated for tempering to exhibit the highest hardness of the steel so that the die thus obtained has a very high anti-wearing resistance and hence long serviceable life. The die is used as a single body of relatively light weight and is versatile in the manner for mounting on a press. The die can withstand a condition of punching at elevated temperatures so that the efficiency of punch-cutting can be improved by using a die heated at a high temperature. In short, the use of the inventive die for punch cutting is very advantageous for mass production where punch cutting of a sheet-like material in a complicated pattern with high accuracy is required.

Figure 14:
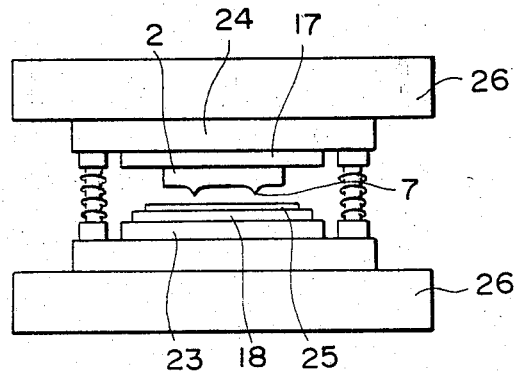
FIG. 14 illustrates the process of punch-cutting of a sheet-like material with the knife-edge die mounted on a press.
Figure 15A:
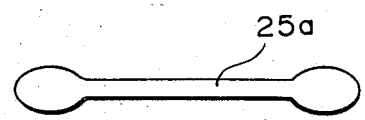
FIGS. 15a and 15b each illustrate a perspective view of the punch-cut pattern of a sheet-like material and the refuse after punch-cutting, respectively.
Figure 15B:
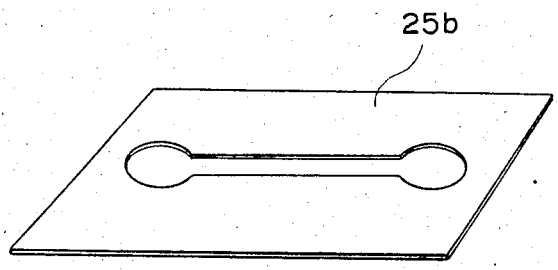

FIG. 14 illustrates the manner in which the inventive knife-edge die 2 is used for punch cutting a pattern in a sheet-like material 25 which may be a metal sheet, metal foil, paper, rubber sheet and plastic sheet as well as a laminated material of these sheet-like materials. As is shown in the figure, the inventive die 2 is mounted on the upper die-set 17 of the upper bed 24 of the press 26 with the knife edge 7 facing downwardly and, on the other hand, the sheet-like material 25 to be punch-cut with the die 2 is placed on the lower die-set 23 of the press 26 with a backing plate 18 therebeween. The backing plate 18 is a board made of a relatively soft metal, rubber, plastic and the like but, preferably, of a hard rubber, paper, phenolic resin and the like due to the inexpensiveness. The backing plate 18 should have sufficient thickness to prevent damage of the knife edge 7 by hitting against the lower die-set 23. The backing plate 18 badly injured by repeated use must be replaced with a new one. FIG. 15a shows the pattern 25a of the sheet-like material obtained by punch cutting and FIG. 15b shows the punched refuse 25b from which the pattern 25a has been taken by punch cutting.

When an electronic circuit board is prepared by the technique of stamping out by use of a die such as those obtained by the present invention, it is sometimes desired that engraved markings such as symbols, characters, line marks and the like are provided on the electroconductive portion, e.g. the metal foil, on the circuit board in consideration of the convenience in the subsequent wiring, connecting and assembly of the circuit board in an electronic instrument. It is a usual practice in such a case that the engraved marking is provided by use of a separate die for engraving in conformity with the desired characters and the like after the circuit board per se is completed.

The above mentioned process for providing an engraved marking on a circuit board is of course very troublesome and time-consuming so that a more efficient method has been eagerly desired therefor. The inventors have come to the idea that the step of providing engraved markings can be performed simultaneously with the step of stamping out by use of a suitably designed die. That is, an electronic circuit board having stamped-out conductive portions on which engraved markings are provided can be manufactured in a single step.

Figure 16:
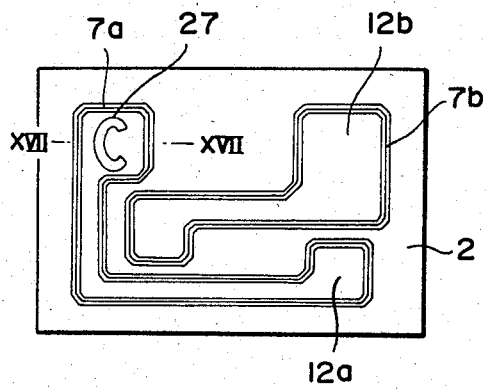
FIG. 16 is a plan view of the die face having two knife edges and an engraving die for an engraved marking of a letter. "C".
Figure 17:
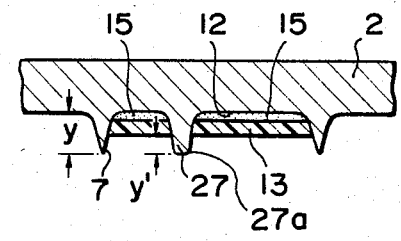
FIG. 17 is a cross sectional view of a knife-edge die with an engraving die.

FIG. 16 is a plan view of the die face of an exemplary one of the inventive die 2 having two knife edges 7a, 7b and a "tooth" or an engraving die 27 for marking an engraved marking of the character "C" and FIG. 17 is a cross sectional view of the die 2 shown in FIG. 16 as cut and viewed along the line XVII—XVII in FIG. 16. Needless to say, the areas 12a and 12b encircled by the knife edges 7a and 7b correspond to the patterns of the electroconductive portions on the circuit board to be stamped out and the tooth "C" 27 must be positioned within one of these encircled areas 12a and 12b so as that the engraving with the tooth can be made on the electroconductive portion.

As is shown in FIG. 17, the knife edges 7a and 7b are sharp and the angle made by the sidewalls of the edge is usually in the range from 20° to 60° since a knife edge having a smaller angle than 20° is readily damaged by repeated stamping whereas a knife edge having an angle larger than 60° is undesirable due to the necessity of a larger shearing load in stamping.

Different from the sharp knife edges for stamping out, on the other hand, the tooth 27 has a flat end having chamfered or rounded shoulders 27a. When the shoulder portion is not chamfered or rounded off, the metal foil to be engraved is sometimes severed or torn by the edged shoulder even though engraving is obtained.

The edged end of the knife edge 7 and the end flat of the tooth 27 are approximately at the same level relative to the die face. Even if the flat end of the tooth 27 is protruded higher than the edged end of the knife edge 7, there may be no particular drawbacks in the simultaneous stamping out and engraving without rupture in the metal foil since the end of the tooth 27 is flat and chamfered at the shoulders 27a. Meanwhile, as is shown in FIG. 17 by the cross section, the die face in the area 12 encircled by the knife edge 7, i.e. the inside recess, is covered with a filling material 13 in order to obtain the advantage described before.

Figure 18:
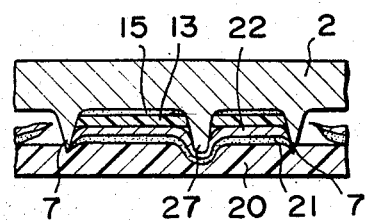
FIG. 18 is an illustration of the stamping out process with a knife-edge die having an engraving die and FIG. 19 is a cross sectional view of the circuit board having an engraved mark in the conductive part formed of the metal foil.
Figure 19:
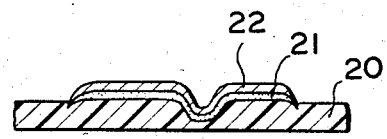

When a circuit board is manufactured by stamping out with the die, the metal foil 22 is stamped out by the knife edge 7 and bonded to the base plate 20 with the adhesive 21 to form the electroconductive portions on the circuit board but the flat end surface of the tooth 27 merely depresses the metal foil 22 and the base plate 20 to cause plastic deformation as is shown in FIG. 18 so that engravings of the characters and the like are obtained on the electroconductive portion of the finished circuit as is shown in FIG. 19 by the cross section.

The knife-edge die with an engraving tooth or engraving die is also manufactured by the techniques of photoetching as described below. The polished surface of a die block is provided with a pattern-wise film of a photocured resist material just in the same manner as described before for marking a die without the engraving tooth except that, in this case, the pattern includes the part corresponding to the engraving tooth for the characters and the like in addition to the line patterns 3' corresponding to the contour lines of the patterns to be stamped out.

As is understood from the description given before, the photoetching is performed with the preparation of an artwork figure as the first step. In drawing the line patterns for the knife edges and the teeth, the width of the line patterns for the characters and the like is usually larger by 0.1 to 0.4 mm than the width of the line pattern for the knife edge, which latter width is determined in consideration of the depth of the recessed areas on the die face of the finished knife-edge die in the range from 0.1 to 2.0 mm. For example, the width of the line pattern for the characters is 0.8 mm when the width of the line pattern for the knife edge corresponding to the contour line of the pattern to be stamped out is 0.6 mm.

Figure 20:
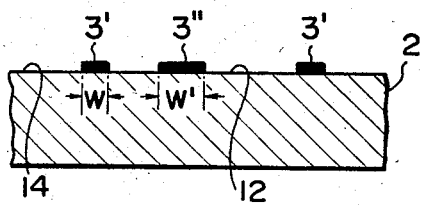
FIGS. 20 to 23 each illustrate consecutively a step in the die making process of the knife-edge die having an engraving die.

By use of a negative transparency prepared with the thus drawn artwork figure by the photographic technique, a patternwise photocured film of a photoresist is formed on the die face of a die block 2 as is shown in FIG. 20 by the cross section, in which the die block 2 is provided with the photoresist film 3' for the line pattern corresponding to the knife edge with a width W and the photoresist film 3" for the characters and the like with a width W', W' being larger by 0.1 to 0.4 mm than W as is mentioned above.

Figure 21:
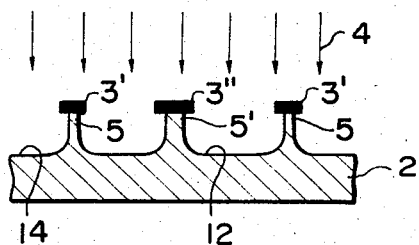

The die block 2 thus provided with the pattern-wise photoresist film 3' and 3" is then subjected to the first etching with an etching solution suitable for the respective material of the die block 2. The attack of the etching solution is mainly directed perpendicularly to the die face of the die block 2 as is shown by the arrows 4 in FIG. 21 forming the recessed areas 12 and 14 inside and outside the line pattern for the knife edge but, as the etching proceeds so far, so-called side etching takes place behind the pattern-wise films of the photoresist as is shown in FIG. 21 leaving the edges 5 and 5' with flat top surface covered by the photoresist films 3' and 3", respectively, which are subsequently removed by a chemical or mechanical means to expose the edges 5 and 5' bare as is shown in FIG. 22.

Figure 22:
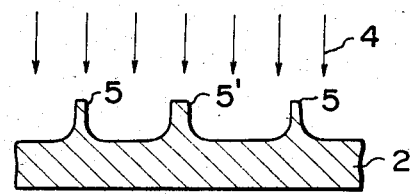

Thereafter, the die block 2 thus provided with the edges 5 and 5' is subjected to the second etching with an etching solution which attacks also mainly perpendicularly to the die face as is shown by the arrows 4 in FIG. 22. In the same time, the effect of etching takes place also in the shoulder portions of the edges 5 and 5' so that these edges 5 and 5' are chamfered and eventually a knife edge 7 is formed from the narrower edge 5 having an acute-angle sharpened edge. At this stage where a sharp knife edge 7 has been formed, the edge 5' having a broader top flat than the edge 5 for the knife edge 7 still remains in a state that no sharp edge is formed but the edge has rounded shoulders which is now the desired tooth 27 as is shown in FIG. 23.

Figure 23:
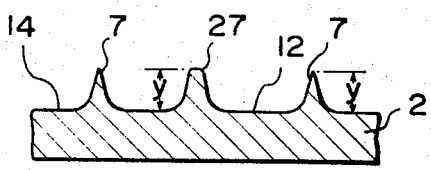

As is indicated by the principle of the above described etching process, the inside recess 12 surrounded by the knife edge 7 and the outside recess 14 surrounding the knife edge 7 necessarily have the same depth y as is shown in FIG. 23. As is mentioned before, it is preferable that the effective depth of the inside recess 12 is adjusted to y' smaller than y by filling with a filling material 13 by use of an adhesive agent 15 as is shown in FIG. 17 in order to improve the effect of bonding of the metal foil to the base plate in the stamping with the die 2.

A further improvement in the knife-edge die made by the inventive method is obtained by a composite die provided with one or more of flat-headed presser dies separately from the knife edge for stamping out metal foils and the like on a circuit board.

When stamping out of a metal foil coated with an adhesive agent and placed on an insulating base plate into a circuit pattern is carried out by use of a knife-edge die for stamping out alone, there may sometimes take place defects such as exfoliation and crease-formation of the metal foil for the circuit. In order to avoid such drawbacks, it is usually practiced that a flat-headed presser die is provided as a separate die from the knife-edge die for stamping out and the insulating base plate and the metal foil with the adhesive agent are moved in a regular pitch under the dies so that the metal foil is first heated and pressed with the presser die on to the base plate to be firmly bonded with the adhesive followed by the stamping out by the knife-edge die.

The above described method of providing a presser die separately from the knife-edge die has problems that the die must be prepared separately taking long time for die making with consequently increased costs for the dies per se and hence with expensiveness of the finished circuit boards manufactured therewith and that centering or precision positioning of the dies on the press is indispensable in mounting of them because otherwise the pattern stamped out with the knife-edge die cannot exactly coincide with the pattern having been heated and pressed with the presser die in advance. In addition, the mechanism for the synchronized movements of these dies is necessarily very complicated and must be operated by a skillful worker.

In order to overcome the above described difficulties, it has been proposed by the inventors that a composite die having one or more of presser dies and a knife-edge die, the latter die having a somewhat larger height than the former, integrally provided on the die face of a die block with a regular pitch d when two or more of the presser dies are provided. Such a composite die can be made as easily as a single knife-edge die so that the overall time for the die making can be greatly decreased. In addition, no skillful workers and complicated mechanism are required for centering or precision positioning of two kinds of dies in mounting the dies on a press in order to obtain coincidence of the patterns so that the productivity of the electronic circuit boards can greatly be improved.

A further improvement is obtained by providing one or two stopping dies lower than the knife-edge die on one side or both sides of the knife edge in the outside recessed areas so as that the stamping out of the circuit board can be performed without the danger of over-incision of the knife edge into the insulating base plate.

When two or more of the flat-headed presser dies are provided on the die face, as is mentioned above, the pitch d or the distance between the adjacent presser dies d should be equal to the distance between the knife-edge die and the presser die adjacent to the knife-edge die.

Figure 24:
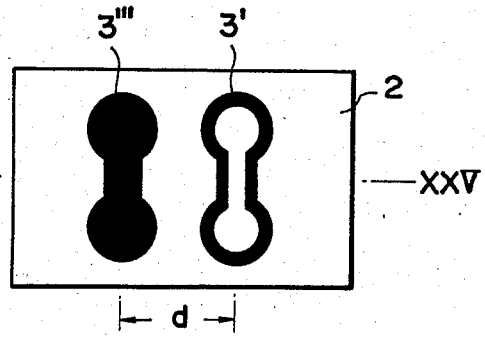
FIG. 24 is a plan view of the die face provided with photoresist films, one for the line pattern of the knife edge and the other for the full pattern of a flat-headed presser die.
Figure 25:
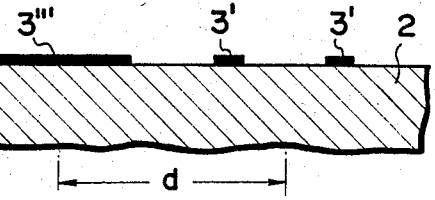
FIGS. 25 to 29 each illustrate consecutively a step of the die making process of the knife-edge die having a flatheaded presser die.

The die making process of the above described composite dies is also carried out by the techniques of photoetching. That is, the first step of the die making process is the preparation of an artwork figure or a negative transparency bearing the transparent line pattern demarcating the contour line of the pattern to be stamped out with the knife-edge die and one or more of transparent patterns corresponding to the flat-headed presser dies. The die block coated with a photoresist material is irradiated through the transparency followed by the development treatment to leave a pattern-wise photo-cured film of the photoresist material as is shown in FIG. 24 by the plan view and in FIG. 25 by the cross sectional view as cut and viewed along the line XXV—XXV in FIG. 24 including the line pattern 3' for the contour of the pattern to be stamped out by the knife edge and the full pattern 3''' for the flat-headed presser die on the die block 2. In these figures, the distance between the line pattern 3' and the full pattern 3''' is called the "pitch" d.

Figure 26:
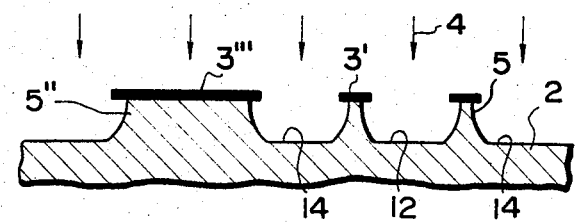
Figure 27:
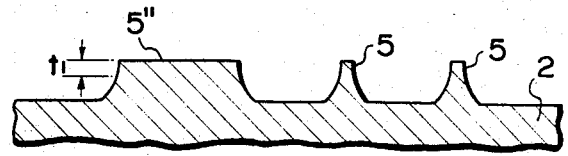

The die block thus provided with the pattern-wise photoresist films 3' and 3''' is then subjected to the first etching with an etching solution to such an extent that the so-called side etching takes place behind the photoresist films 3' and 3''' in addition to the vertical attack of the etching solution as shown by the arrows 4 in FIG. 26. Thereafter, the photoresist films are removed either mechanically or chemically to expose the edge 5 and the plateau-like portion 5'''' bare as is shown in FIG. 27 and the plateau 5'''' is mechanically ground to reduce the height by $t_1$ as is shown in FIG. 28.

Figure 28:
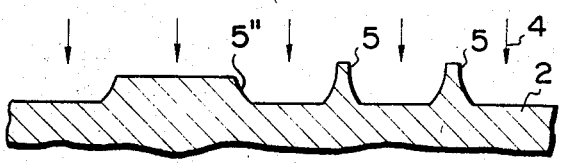
Figure 29:
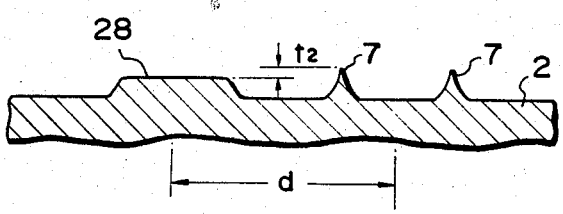

Then a second etching is carried out on the die face as is shown in FIG. 28 by the arrows 4 whereby the edge 5 is sharpened into a knife edge 7 and the plateau 5'''' having a reduced height is shaped into the flat-headed presser die 28 with rounded shoulders as is shown in FIG. 29. The height difference between the knife edge 7 and the top flat of the presser die 28 is $t_2$ in this finished composite die. It is of course optional that the mechanical grinding of the plateau 5'''' is omitted and the second etching is carried out directly after removal of the photoresist films to sharpen the edge 5 into the knife edge 7 followed by mechanical grinding of the plateau 5'''' by a height difference $t_1$. The height difference between the knife edge 7 and the presser die 28 should be such that the press-bonding by the presser die 28 is complete when the metal foil and the adhesive layer on the base plate are just cut by the knife edge 7. Meanwhile, the height difference $t_2$ in the finished composite die is equal to or smaller than $t_1$. It is preferable that the mechanical grinding of the plateau 5‴ is undertaken before the second etching because the shoulder portions of the presser die must be in any way chamfered or rounded off in order to avoid injuring of the metal foil by the edged shoulders of the presser die.

Figure 30:
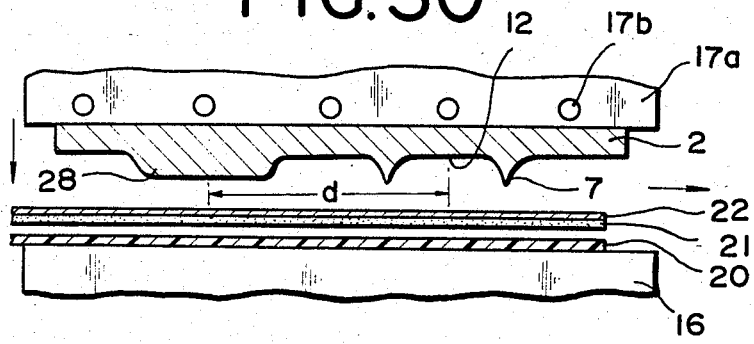
FIGS. 30 to 32 illustrate each consecutively the manner for using the knife-edge die having a presser die in the continuous stamping out of circuit boards.
Figure 31:
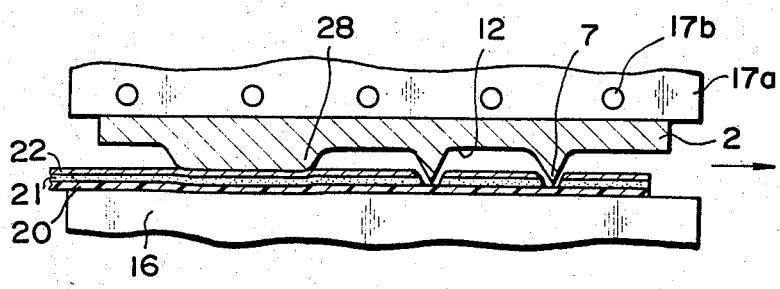
Figure 32:
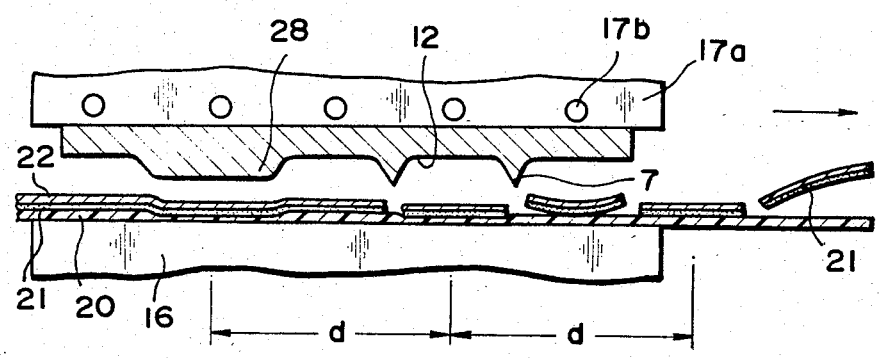

FIG. 30 to FIG. 32 illustrate the manner in which the above prepared composite die is used for stamping out a metal foil on an insulating base plate. As is shown in FIG. 30, the composite die 2 is mounted on the hot plate 17a having tubular heaters 17b built therein with the knife edge 7 and the flat-headed presser die 28 facing downwardly. On the other hand, the insulating base plate 20 and a metal foil coated with an adhesive agent 21 are placed on the lower die-set 16, the latter being on the former with the layer of the adhesive agent 21 therebetween.

When the die 2 is lowered on to the metal foil 22 as is shown in FIG. 31, the portion of the metal foil under the knife-edge die having the knife edge 7 is stamped out and adhesively bonded to the surface of the insulating base plate 20 while the portion of the metal foil 22, located at a distance of the pitch d from the former portion stamped out as mentioned above, is pressed downwardly by the presser die 28 and adhesively bonded to the base plate 20 with the aid of the adhesive agent 21 with slight deformation. In this case, pressing with the presser die 28 is effective in expelling the air interstitially remaining between the metal foil 22 and the base plate 20.

Thereafter, the composite die 2 is lifted and the base plate 20 and the metal foil 22 are moved together to the right in the figure by the pitch d so that the portion having been pressed and bonded preliminarily by the presser die 28 comes just below the knife-edge die 7 and the next step of the simultaneous stamping out and press-bonding is carried out just in the same manner as above. By repeating the above described process, the portion of the metal foil 22 stamped out by the knife edge 7 always has been pressed and bonded to the base plate in advance with the presser die 28 so that the adhesive bonding of the conductive part of the metal foil 22 to the base plate is much more complete than without the preliminary press-bonding with the presser die 28, where pressing of the metal foil is effected only by the inside recess 12 of the knife-edge die or the filling material in the inside recess 12 as is described before. FIG. 32 illustrates an aspect in such a continuous process in which stamping out of the first two conductive parts have been completed and the preliminary press-bonding of the next coming part has been done with the die 2 being lifted.

As is understood from the above description, the step-wise transfer of the base plate 20 and the metal foil 22 by the pitch d as synchronized with the up and down movement of the die 2 results in continuously producing the electronic circuit boards having very accurately patterned conductive parts with the metal foil very firmly bonded to the base plate.

The above described composite die 2 is provided with a knife-edge die and a flat-headed presser die as arranged on the die face with a distance or "pitch" d. In order to obtain sufficiently strong adhesive bonding of the metal foil to the base plate, it is essential that the metal foil is pressed at an elevated temperature for a sufficiently long time under the pressure by the presser die. When the metal foil is pressed with the presser die, the temperature of the presser die necessarily is decreased due to the loss of heat and the temperature is again increased when the presser die becomes apart from the metal foil by the heat supply from the heaters. When the velocity of stamping is increased more and more or the operation time of one cycle is decreased shorter and shorter, the equilibrium between the heat supply and heat loss shifts toward insufficient bonding effect of the metal foil under the presser die as a consequence of the decreased die temperature and the shortened pressing time.

Figure 33:
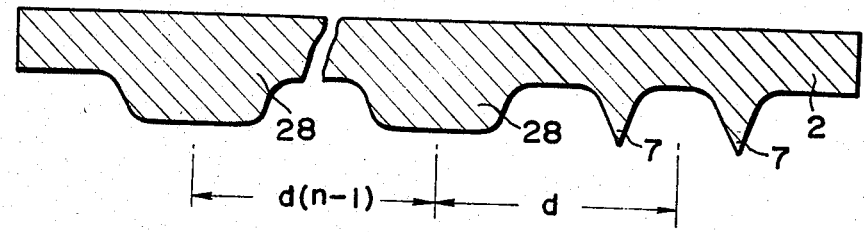
FIG. 33 is a cross sectional view of a knife-edge die provided with a plural number of the presser dies on the same die face.

The above described problem of insufficient preliminary bonding by the presser die can be overcome by providing a plural number of the presser dies on the same die face, each locating at a distance equal to the pitch d from the neighboring ones so as that the effective heat capacity of the presser dies as a whole may be larger than with a single presser die. For example, when the number of the presser dies is n, the heating effect can be increased to n times at the maximum in comparison with a single presser die and the stamping velocity can be increased accordingly. FIG. 33 illustrates such a composite die having n presser dies by the cross section. As is readily understood and shown in the figure, the distance between the first presser die and the last presser die is $d \times (n-1)$.

It is sometimes preferred that a plural number of the flat-headed presser dies are provided on both sides of the knife-edge on the same die face so as that the pattern of the metal foil stamped out by the knife-edge die after the preliminary press-bonding with one or a set of the presser dies positioned on one side of the knife-edge die is further pressed with heating by the presser die or dies positioned on the other side of the knife-edge die resulting in more complete adhesive bonding of the metal foil pattern to the base plate as well as in improved flatness of the electroconductive pattern stamped out.

The above described composite die having a plural number of the presser dies can be manufactured as easily as a composite die having a single presser die because the only difference in the die making process is the preparation of the artwork figure on which the full patterns corresponding to the presser dies must be drawn in plurality, each located at an accurate distance d from the neighboring ones. The techniques of stamping with such a composite die have no particular problems without the necessity of centering or precision positioning of the knife-edge die and the presser dies. As a consequence, the production costs of electronic circuit boards can be greatly reduced.

A problem in such a composite die having a plural number of the presser dies is that, as the number of the presser dies is increased, the overall length of the composite die naturally increases and even a slight inclination of the die mounting may influence the depth of incision with the knife edge 7 into the metal foil 20 or the insulating base plate 22, especially, when the presser dies are provided at only one side of the knife-edge die. When the depth of incision is insufficient, no clear-cut stamping out of the metal foil is obtained while a too large depth of incision may unduly injure the base plate.

Figure 34:
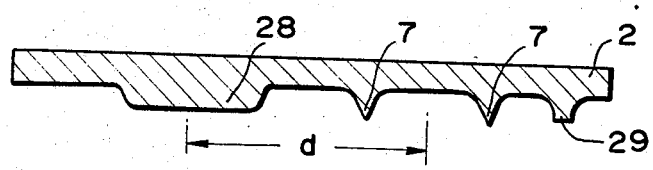
FIG. 34 is a cross sectional view of a knife-edge die having a limiter die on one side of the knife edge and FIG. 35 is an illustration of the manner for using such a die.

The above described problem of the difficulty in the accurate die mounting can be avoided by an ingenious improvement of providing one or two stopper dies or limiter dies on one or both sides of the knife-edge. FIG. 34 illustrates an example of such a composite die with a limiter die 29 by the cross section. In this case, the limiter die 29 is provided on the vicinity of the knife edge 7 at the side remote from the flat-headed presser die 28.

Figure 35:
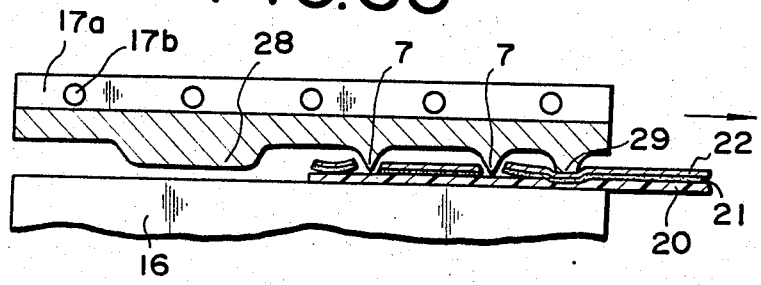

The head of the limiter die should be flat and sufficiently broad in order to ensure reliable limiting effect and the height difference between the knife edge 7 and the limiter die 29 is naturally determined in accordance with the thickness of the metal foil 22 and the adhesive layer 21 so as that the stamping out of the metal foil 22 and the adhesive layer 21 with the knife edge 7 is just complete when the downward movement of the die is interrupted by the limiter die 29 contacting the surface of the metal foil 22. This relationship is well illustrated in FIG. 35.

The die-making process of a die having a knife-edge die and a limiter die is similar to the process for the die with a flat-headed presser die. That is, preparation of the artwork figure to the first etching may be carried out in just the same manner except that the artwork figure has the pattern corresponding to the limiter die. The top surface of the portion corresponding to the limiter die is ground either after the first or after the second etching to reduce the height to ensure optimum depth of incision of the knife edge. It is optional that a plural number of the limiter dies are provided on the same die face as distributed to ensure uniformity of incision of the knife edge.

Following are the examples to illustrate the procedure of manufacturing and the manner of use of the inventive stamping out dies in further detail.

EXAMPLE 1

On a surface of a low-carbon steel die block well tempered and polished in advance, a line pattern of a photocured photoresist film was formed by use of an artwork figure of the corresponding line pattern having a varied width W as indicated in Table 1 below. The die face thus provided with the line pattern of the photoresist film was subjected to the first etching with an etching solution containing iron (III) chloride to an extent that substantial side etching took place behind the photoresist film. After removal of the photoresist film by a mechanical means to expose the edge formed behind the photoresist film, a second etching with the same etching solution was carried out to sharpen the edge into a knife edge. Table 1 below summarizes the results of the above die making to give the time for the first etching, width of the edge, time for the second etching, the height of the finished knife edge or rather the depth of the inside and outside recesses, and the thickness of the sheet most suitable to be stamped out with the knife-edge die for the respective width W of the line pattern drawn on the artwork figure.

TABLE 1

| Width of line pattern W, mm | Time of first etching, minutes | Width of edge x, mm | Time of second etching, seconds | Height of knife edge y, mm | Thickness of sheet to be stamped out, mm |
|---|---|---|---|---|---|
| 0.2 | 7 | 0.02–0.05 | 10 | 0.13–0.15 | 0.065 |
| 0.4 | 14 | 0.05–0.10 | 40 | 0.20–0.23 | 0.120 |
| 0.6 | 21 | 1.10–0.17 | 120 | 0.31–0.34 | 0.170 |
| 0.8 | 28 | 0.12–0.20 | 200 | 0.45–0.50 | 0.250 |

All of the above manufactured knife-edge dies were suitable for stamping out various kinds of metal foils, plastic sheets and laminates thereof to give satisfactory results. Although the width W of the line pattern in the above test manufacturing was limited to 0.2–0.8 mm, similarly satisfactory results were obtained with W in the range from 0.1 to 2.0 mm which should appropriately determined in accordance with the thickness of the sheet to be stamped out with the knife-edge die.

EXAMPLE 2

The inside recess of the knife-edge die manufactured in Example 1 having a knife-edge height y of 0.31–0.34 mm was filled with two sheets of a fluorocarbon resin each having a thickness of 0.1 mm by the technique of pressing with the aid of an adhesive agent applied on each of the fluorocarbon resin sheets. The effective depth y' of the inside recess in the thus finished stamping-out die was 0.11 to 0.14 mm.

The thus prepared die was mounted on the upper die-set of a press and stamping out test was carried out with a base plate of a phenolic resin-impregnated paper laminate having a thickness of 1.6 mm and a copper foil having a thickness of 0.035 mm coated with a phenolic resin adhesive agent in a thickness of 0.020 mm placed on the lower die-set, the latter being on the former with the adhesive layer therebetween. The stamping out of the metal foil into a circuit pattern with the die heated at 110°–130° C. and a pressure of 10–20 tons of the press gave satisfactory results with respect to the incisiveness of the knife edge, adhesive bonding of the metal foil to the base plate within the area encircled by the knife edge, i.e. inside recess, and the peelability of the metal foil in the areas surrounding the knife edge, i.e. outside recess.

EXAMPLE 3

Several knife-edge dies each having a knife edge height y in the range from 0.20 to 0.90 mm were manufactured in the same manner as in Example 1. The die was mounted on a cranktype press and used for punch-cutting a sheet-like work such as a copper foil having a thickness of 0.018 to 0.350 mm, soft steel belt having a thickness of 0.250 to 0.450 mm, polyester film having a thickness of 0.025 to 0.250 mm, overlay film coated with an adhesive having a thickness of 0.050 to 0.150 mm, Capton film having a thickness of 0.025 to 0.125 mm and FPC film having a thickness of 0.050 to 0.250 mm. Punch-cutting of the sheet-like work with a phenolic resin plate of 1.6 mm thickness as a backing plate under a pressure of 2 to 50 tons of the press gave satisfactory punch-cut patterns of the sheet having no burrs at the sections by virtue of the incisiveness of the knife-edge.

What is claimed is:

1. A method for manufacturing a knife-edge die provided with at least one flat-headed presser die which comprises the steps of (a) putting a transparency bearing a line pattern having a uniform line width, the center line of said line pattern relative to the width thereof being along the contour line of the pattern desired to be stamped out and a full pattern in the form of the pattern desired to be stamped out, said line pattern and said full pattern being disposed in parallel with each other, on the surface of a die block coated with a film of a photoresist material in direct contact therewith, (b) irradiating the photoresist film with light through the transparency to have the photoresist material photocured under the line pattern and the full pattern on the transparency, (c) developing the photoresist material to leave the photocured films pattern-wise corresponding to the line pattern and the full pattern on the transparency, (d) subjecting the surface of the die block to a first etching to such an extent that substantial side etching takes place behind the photoresist film corresponding to the line pattern, (e) removing the photoresist films from the surface of the die block so as to expose the edge and a plateau-like flat surface behind the photoresist film corresponding to the full pattern, (f) grinding the plateau-like flat surface to reduce the height thereof, and (g) subjecting the surface of the die block with the thus exposed edge and the ground plateau-like flat surface to a second etching to such an extent that the edge is sharpened to form a knife edge and the plateau-like flat surface is provided with a rounded shoulder to form a presser die.

* * * * *